US010101387B1

(12) United States Patent
Iyer et al.

(10) Patent No.: US 10,101,387 B1
(45) Date of Patent: Oct. 16, 2018

(54) SHARING A JTAG INTERFACE AMONG MULTIPLE PARTITIONS

(71) Applicant: Intel Corporation, Santa Clara, CA (US)

(72) Inventors: Mahesh A. Iyer, Fremont, CA (US); Yi Peng, Newark, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/429,008

(22) Filed: Feb. 9, 2017

(51) Int. Cl.
*G01R 31/28* (2006.01)
*G01R 31/317* (2006.01)
*G01R 31/3177* (2006.01)

(52) U.S. Cl.
CPC ..... *G01R 31/3172* (2013.01); *G01R 31/3177* (2013.01); *G01R 31/31705* (2013.01); *G01R 31/31726* (2013.01)

(58) Field of Classification Search
None
See application file for complete search history.

(56) References Cited

U.S. PATENT DOCUMENTS 6,754,862 B1 * 6/2004 Hoyer ................. G06F 17/5027 714/725
7,036,046 B2 4/2006 Rally et al.
7,454,556 B1 * 11/2008 Knapp ............. H03K 19/17744 326/37
7,739,517 B2 * 6/2010 Sahita ................. G06F 12/1458 713/193
2011/0068823 A1 * 3/2011 German ........... H03K 19/17744 326/37
2014/0118026 A1 * 5/2014 Aldragen ........... H03K 19/1776 326/41
2015/0046763 A1 * 2/2015 Makar ............ G01R 31/318555 714/727

OTHER PUBLICATIONS

U.S. Appl. No. 15/432,810, filed Feb. 14, 2017, Peng.

* cited by examiner

*Primary Examiner* — Daniel McMahon
(74) *Attorney, Agent, or Firm* — Fletcher Yoder, P.C.

(57) ABSTRACT

An integrated circuit device includes a first partition and a second partition. The integrated circuit device also includes a Joint Test Action Group (JTAG) system that controls at least a portion of the integrated circuit device via multiple logic signals. The JTAG system includes a JTAG interface receives the multiple logic signals. The JTAG system also includes a JTAG hub instantiated in the first partition and being communicatively coupled to the JTAG interface. The JTAG system further includes JTAG-based logic instantiated in the second partition. The integrated circuit device further includes an interface instantiated in the first partition configured to communicatively couple the JTAG hub to the JTAG-based logic.

20 Claims, 3 Drawing Sheets

SHARING A JTAG INTERFACE AMONG MULTIPLE PARTITIONS

BACKGROUND

The present disclosure relates generally to analyzing a hardware device in connection with a computer system. More particularly, the present disclosure relates to sharing an interface of an integrated circuit among multiple partitions of the integrated circuit.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In the 1980s, integrated circuits were becoming commonplace. However, testing circuit boards that included the integrated circuits for faulty connections (e.g., due to imperfections in solder joints on the circuit boards, board connections, or bonds and bond wires from integrated circuit pads to pin lead frames) was difficult because the connections were unavailable to testing probes. The Joint Test Action Group (JTAG) standard (IEEE standard 1149.1) was developed to provide an interface on or between integrated circuits to discover these faults.

For a field programmable gate array (FPGA), a single standard JTAG interface is extended to a core fabric of the FPGA to build JTAG-based logic. Specifically, for an FPGA, a single JTAG hub is created in the core fabric to enable multiple instances of JTAG-based logic to share the single JTAG interface. However, an FPGA may be physically divided into multiple partitions, for example, to implement partial reconfiguration. While the single hub may be created in the core fabric of a partition (e.g., a root partition of the FPGA) to enable JTAG-based logic in the root partition to share the single JTAG interface, if JTAG-based logic were also created in other partitions of the FPGA, such JTAG-based logic would be unable to share the single JTAG interface.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to sharing an interface of an integrated circuit among multiple partitions of the integrated circuit. The integrated circuit may be a field programmable gate array (FPGA), and the interface may be a Joint Test Action Group (JTAG) interface of the FPGA. A JTAG hub is created in a single partial reconfiguration partition (e.g., a root partition) of the FPGA. System level debugging (SLD) endpoints are connected to JTAG hub via SLD endpoint interfaces, whether the SLD endpoints are located in the root partition or other partitions of the FPGA. When an SLD endpoint in another partition is added, removed, or otherwise changed such that the other partition is recompiled, portions of the JTAG hub and SLD endpoint interfaces associated with the recompiled SLD endpoint may be synthesized or recompiled to account for the changes to the other partition. In this manner, multiple partitions may share and use the JTAG interface.

In a first embodiment, an integrated circuit device includes a first partition and a second partition. The integrated circuit device also includes a Joint Test Action Group (JTAG) system that controls at least a portion of the integrated circuit device via multiple logic signals. The JTAG system includes a JTAG interface receives the multiple logic signals. The JTAG system also includes a JTAG hub instantiated in the first partition and being communicatively coupled to the JTAG interface. The JTAG system further includes JTAG-based logic instantiated in the second partition. The integrated circuit device further includes an interface instantiated in the first partition configured to communicatively couple the JTAG hub to the JTAG-based logic.

In a second embodiment, a Joint Test Action Group (JTAG) system includes a JTAG interface of an integrated circuit that receives multiple JTAG logic signals. The JTAG system also includes a JTAG hub instantiated in a first partition of the integrated circuit and communicatively coupled to the JTAG interface. The JTAG system further includes a system level debugging (SLD) endpoint instantiated in a second partition of the integrated circuit. The JTAG system also includes an SLD endpoint interface instantiated in the first partition configured to communicatively couple the JTAG hub to the SLD endpoint.

In a third embodiment, a method includes creating a first partition in an integrated circuit. The method also includes instantiating a Joint Test Action Group (JTAG) hub in the first partition, the JTAG hub being communicatively coupled to a JTAG interface. The method further includes creating a second partition in the integrated circuit. The method also includes instantiating JTAG-based logic in the second partition. The method further includes instantiating an interface in the first partition that is configured to communicatively couple the JTAG hub to the JTAG-based logic.

Various refinements of the features noted above may be made in relation to various aspects of the present disclosure. Further features may also be incorporated in these various aspects as well. These refinements and additional features may be made individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A field programmable gate array (FPGA) may have a single standard Joint Test Action Group (JTAG) interface extended to a core fabric of the FPGA to build JTAG-based logic. A single JTAG hub is created in a partition of the core fabric to enable multiple instances of JTAG-based logic (e.g., system level debugging (SLD) endpoints) in the partition to share the single JTAG interface. Embodiments of the present disclosure relate to providing access to the JTAG interface from multiple instances of JTAG-based logic located in multiple partitions of the FPGA. A JTAG hub is created in a single partial reconfiguration partition (e.g., a root partition) of the FPGA. System level debugging (SLD) endpoints are connected to JTAG hub via SLD endpoint interfaces, whether the SLD endpoints are located in the root partition or other partitions of the FPGA. When an SLD endpoint in another partition is added, removed, or otherwise changed such that the other partition is recompiled, portions of the JTAG hub and SLD endpoint interfaces associated with the recompiled SLD endpoint may be synthesized or recompiled to account for the changes to the other partition. In this manner, multiple partitions may share and use the JTAG interface.

Additional information related to the JTAG interface, JTAG hubs, and the like, is included in U.S. Pat. No. 7,036,046, entitled "PLD debugging hub," which is incorporated herein by reference in its entirety for all purposes. While the present disclosure describes providing access to the JTAG interface with respect to an FPGA, it should be understood that the disclosed embodiments may apply to any integrated circuit that includes a JTAG interface.

Figure 1:
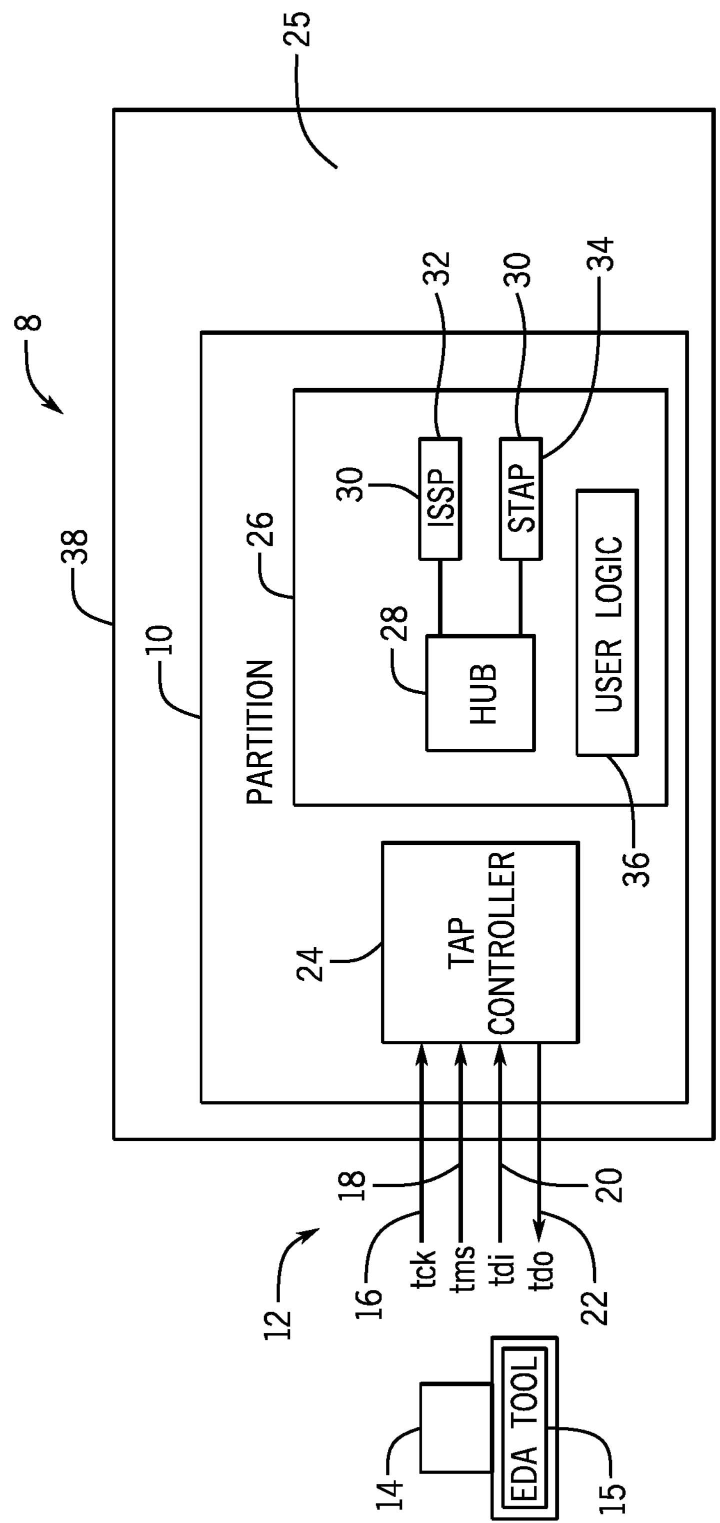
FIG. 1 is a block diagram of a Joint Test Action Group (JTAG) system that includes a field programmable gate array (FPGA) and a JTAG interface, in accordance with an embodiment of the present disclosure.

Keeping this in mind, FIG. 1 is a block diagram of a JTAG system 8 that includes an FPGA 10 and a JTAG interface 12, in accordance with an embodiment of the present disclosure. The JTAG interface 12 (e.g., JTAG-to-core interface) may enable a control system, such as a computing device 14, to communicate with, control, and/or debug the FPGA 10. In some embodiments, the control system may be any suitable device that may control the FPGA 10 and/or the JTAG system 8, such as any device with a processor, microprocessor, or any combination thereof (e.g., a server, laptop, mobile device, and the like). The computing device 14 may include one or more electronic design automation (EDA) software tools 15 used to design or configure the FPGA 10. Specifically, the EDA tool 15 may design, configure, store, and/or track resources related to the JTAG system 8.

The JTAG interface 12 may include four logic signals: (1) TCK (Test Clock) signal 16 that is used to synchronize internal state machine operations of a JTAG Test Access Port (TAP) controller 24; (2) TMS (Test Mode Select) signal 18 that is sampled at a rising edge of TCK to determine a next state; (3) TDI (Test Data In) signal 20 that represents data shifted into test or programming logic of the FPGA 10 and is sampled at the rising edge of TCK when the internal state machines is in a correct state; and (4) TDO (Test Data Out) signal 22 that represents data shifted out of the test or programming logic of the FPGA 10 and is valid on a falling edge of TCK when the internal state machine is in the correct state. The JTAG interface 12 may also include a fifth logic signal TRST (Test Reset) which, when available, can reset the state machine of a JTAG TAP controller 24. The FPGA 10 may include pins corresponding to each logic signal.

The TAP controller 24 includes the state machine whose transitions are controlled by the TMS signal 18. The state machine may control the behavior of the JTAG system 8. Typically, the TAP controller 24 may be implemented as hard logic (e.g., a dedicated hardware resource provided by the FPGA 10). However, in some embodiments, the TAP controller 24 may be implemented as soft logic (e.g., realized in a core fabric 25 of the FPGA 10). The core fabric 25 of the FPGA 10 may include logic units of the FPGA 10, such as logic modules (e.g., adaptive logic modules), look-up tables, adaptive look-up tables, flip-flops, arithmetic logic, digital signal processing (DSP) units, random access memories (RAMs), and the like.

The TAP controller 24 may communicatively couple to and control a JTAG hub 28 instantiated in a partition 26 of the FPGA 10. The partition 26 may be a physical division of resources of the FPGA 10. The hub 28 may automatically arbitrate between multiple JTAG-based logic instances (e.g., system level debugging (SLD) endpoints 30) in the partition 26 that share the JTAG interface 12. That is, the hub 28 may control delivery of signals to and from the SLD endpoints 30. For example, the hub 28 may act as an arbiter that routes the TDI signal 20 between each SLD endpoint 30. In some embodiments, the hub 28 may include a state machine that mirrors the state machine of the TAP controller 24. Typically, the hub 28 and the SLD endpoints 30 may be implemented as soft logic. However, in some embodiments, the hub 28 and the SLD endpoints 30 may be implemented as hard logic.

The SLD endpoints 30 represent communication channels for end applications in the FPGA 10 that use the JTAG interface 12. Each end application, such as a SignalTap II Logic Analyzer, that uses a JTAG communication resource has its own communication channel (e.g., a SignalTap (STAP) interface 34) in the form of an SLD endpoint 30 to the hub 28. An end application may be any application or module programmed into the FPGA 10. The end application may analyze, control, or debug user logic 36. Each SLD endpoint 30 may have an instruction register and a set of data registers. The SLD endpoints 30 may include an In-System Sources and Probes (ISSP) interface 32, the SignalTap (STAP) interface 34, an In-System Memory Content Editor (ISMCE) interface, a JTAG bridge, and the like. The SLD endpoints 30 shown in FIG. 1 are merely illustrative, and it should be understood that any suitable SLD endpoint 30 (e.g., a JTAG Debug Bus Master interface, a JTAG Debug Packet Streamer interface, a Microprocessor Debugger Module interface, and the like) is contemplated in the present disclosure. The STAP interface 34 may communicatively couple to the user logic 36, which may be any electronic design created by a user that is programmed into the FPGA 10.

As illustrated, the FPGA 10 may be used in any suitable device 38 that may in turn use a configurable integrated circuit with the added benefit of flexibility from using the FPGA 10. For example, the device 38 may be a computer, computer interface, or any suitable computer component. The device 38 may also be telemetry, sensing, and/or control instrumentation. In some embodiments, the device 38 may be an automated robotic device. The device 38 may also be a cell phone or other communication device.

Figure 2:
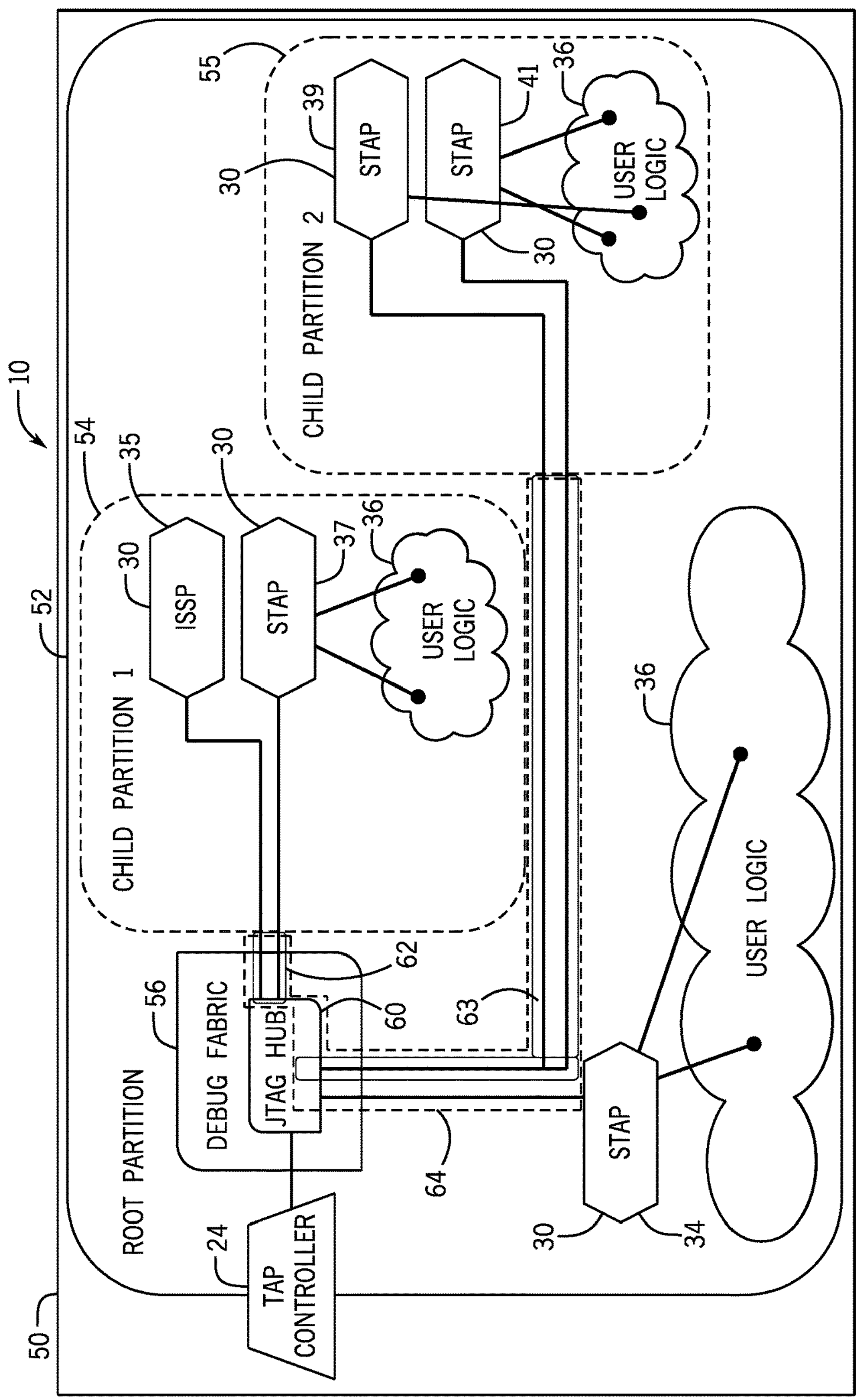
FIG. 2 is a block diagram illustrating a JTAG system that includes a root partition and child partitions sharing the JTAG interface of FIG. 1, in accordance with an embodiment of the present disclosure.

FIG. 2 is a block diagram illustrating a JTAG system 50 that includes a root partition 52 and child partitions 54 and 55 sharing the JTAG interface 12 of FIG. 1, in accordance with an embodiment of the present disclosure. A partition is a block of the FPGA 10 that may be isolated from other parts of the FPGA 10, such that the partition may be reconfigured without reconfiguring the other parts of the FPGA 10. Multiple partitions may be used, for example, to implement partial reconfiguration of the FPGA 10. Partial reconfiguration enables modification of the FPGA 10 while in operation by loading a partial configuration file (e.g., a partial bit file). That is, the entire FPGA 10 may be configured using a full bit file. One or more partial bit files may then be downloaded to modify partial reconfiguration regions of the FPGA 10 without compromising integrity of applications running on parts of the FPGA 10 that are not being reconfigured.

The root partition 52 (e.g., a parent partition) and the child partitions 54 and 55 are arranged hierarchically, wherein each of the child partition 54 and 55 is nested or resides inside the root partition 52. The root partition 52 includes debug fabric 56—or logic units of the FPGA 10, such as logic modules (e.g., adaptive logic modules), look-up tables, adaptive look-up tables, flip-flops, arithmetic logic, and the like, used and/or suitable for debugging purposes. The debug fabric 56 of the FPGA 10 may be a portion of the core fabric 25 that is suitable, assigned, and/or used for debugging purposes.

The debug fabric 56 of the root partition 52 includes a JTAG hub 60 that may communicatively couple to the TAP controller 24. As such, the hub 60 may receive and send signals from and to the TAP controller 24. As illustrated, the hub 60 may communicatively couple to an SLD endpoint 30 in the root partition 52, such as a STAP interface 34. The STAP interface 34 couples to the user logic 36 of the root partition 52.

For each partition of the FPGA 10 that has JTAG-based logic (e.g., an SLD endpoint 30), a SLD endpoint interface 62 is configured in the root partition 52 to communicatively couple to the JTAG-based logic. As illustrated, the child partition 54 includes two SLD endpoints 30 (ISSP interface 35 and STAP interface 37). To enable JTAG functionality to the two SLD endpoints 30 in the child partition 54, the SLD endpoint interface 62 is configured (e.g., by the EDA tool 15). Similarly, a second SLD endpoint interface 63 is configured to enable JTAG functionality to two SLD endpoints 30 (ISSP interface 39 and STAP interface 41) in the child partition 55.

The SLD endpoint interfaces 62 and 63 include reconfigurable logic. That is, the SLD endpoint interfaces 62 and 63 may include logic elements, routing wires, and other logic that may be reconfigured by partial reconfiguration. As such, if one or more SLD endpoints 30 are changed, the one or more SLD endpoint interfaces 62 and 63 associated with the one or more SLD endpoints 30 may be reconfigured to account for the changes (e.g., by the EDA tool 15). For example, a user may remove the ISSP interface 35 in the child partition 54 by recompiling the child partition 54. The EDA tool 15 may automatically account for the removal of the ISSP interface 35 in the child partition 54 by reconfiguring a portion of the JTAG hub 60 (e.g., associated with the ISSP interface 35 in the child partition 54) and the SLD endpoint interface 62 to account for the removal of the ISSP interface 35. Specifically, the portion of the JTAG hub 60 associated with the ISSP interface 35 in the child partition 54 may be updated to acknowledge that the ISSP interface 35 in the child partition 54 was removed and reconfigurable logic of the SLD endpoint interface 62 may be reconfigured to provide JTAG functionality only to the STAP interface 37 of the child partition 54.

The EDA tool 15 may automatically track the portions of the JTAG hub 60 and the SLD endpoint interface 62 associated with each SLD endpoint 30 of each partition of the FPGA 10. As such, updates to the JTAG hub 60 and the SLD endpoint interfaces 62 and/or 63 as a result of a change (e.g., addition, removal, and the like) to an SLD endpoint 30 of a child partition (e.g., 54 and/or 55) may be performed automatically by the EDA tool 15.

Moreover, a partial reconfiguration region 64 typically includes the JTAG hub 60 to update changes in SLD endpoints 30 in the root partition 52 may be expanded to include the SLD endpoint interfaces 62 and/or 63. In this manner, when changes to an SLD endpoint 30 of a child partition (e.g., 54 and/or 55) occur, the partial reconfiguration region 64 may be recompiled (e.g., by the EDA tool 15) without compromising integrity of applications running on parts of the FPGA 10 that are not being reconfigured.

Additionally, portions of the partial reconfiguration region 64 (e.g., associated with an SLD endpoint 30 that has been changed) may be incrementally compiled (e.g., by the EDA tool 15), such that other portions of the partial reconfiguration region 64 are not compiled. That is, incremental recompilation refers to compiling small parts of a design (that have changed) to implement new functionality, without altering other parts of unchanged logic circuitry. Any suitable incremental compilation technique may be used, such as rapid reconfiguration and the like. In this manner, reconfiguration of the entire partial reconfiguration region 64 may be avoided. As such, automatically recompiling the partial reconfiguration region 64 due to an SLD endpoint 30 in a child partition (e.g., 54 and/or 55) being changed is not more expensive (e.g., as related to time and resource usage) than recompiling the partial reconfiguration region 64 itself.

In some embodiments, the EDA tool 15 may configure the partial reconfiguration region 64 while maintaining partial reconfiguration compliance in the FPGA 10. Specifically, the EDA tool 15 may add or configure the reconfigurable logic of the partial reconfiguration region 64 at a boundary of the partial reconfiguration region 64 to maintain partial reconfiguration compliance.

Figure 3:
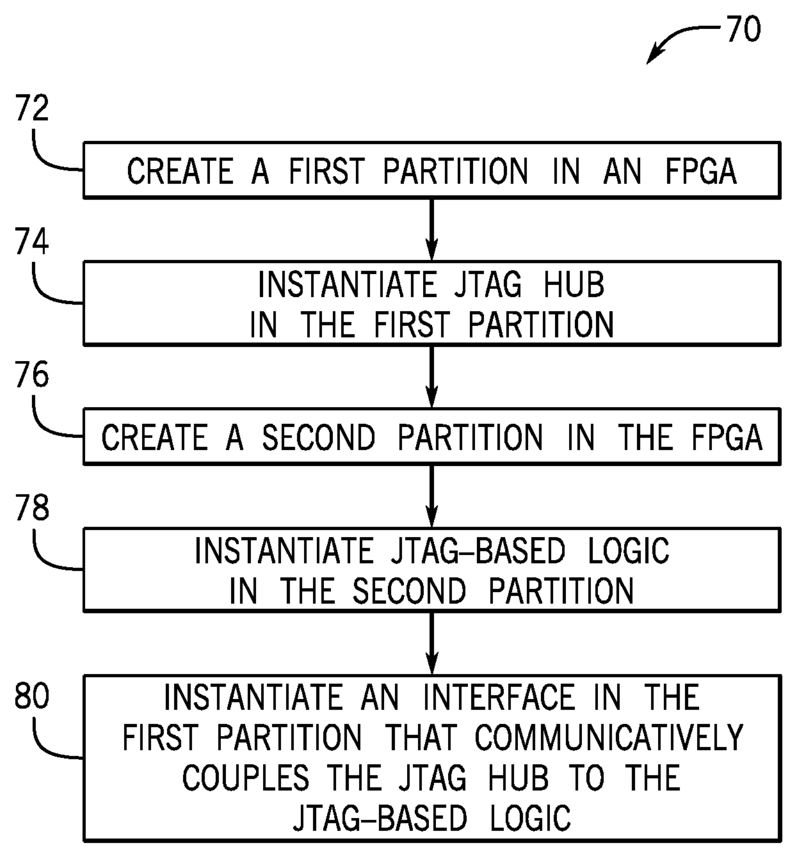
FIG. 3 is a flowchart of a method 70 for sharing the JTAG interface 12 of FIG. 1 among multiple partitions, in accordance with an embodiment of the present disclosure.

FIG. 3 is a flowchart of a method 70 for sharing the JTAG interface 12 of FIG. 1 among multiple partitions, in accordance with an embodiment of the present disclosure. The method 70 may be performed by any suitable device that may control the FPGA 10, such as a control system (e.g., the computing device 14). While the method 70 is described using steps in a specific sequence, it should be understood that the present disclosure contemplates that the described steps may be performed in different sequences than the sequence illustrated, and certain described steps may be skipped or not performed altogether. In some embodiments, the method 70 may be implemented by executing instructions stored in a tangible, non-transitory, computer-readable medium, such as one or more memory devices of the computing device 14, and using one or more processors of the computing device 14.

The control system 14 creates a first partition (e.g., the root partition 52) in the FPGA 10 (block 72). The control system 14 then instantiates the JTAG hub 60 in the first partition 52, the JTAG hub 60 being communicatively coupled to the JTAG interface 12 (block 74).

The control system 14 also creates a second partition (e.g., the child partition 54) in the FPGA 10 (block 76). In some embodiments, the second partition 54 may be a child or nested partition of the first partition 52. Alternatively, the second partition 54 may be a separate sibling partition that is not nested in the root partition 52. The control system 14 then instantiates JTAG-based logic in the second partition 54. For example, the control system 14 may instantiate the SLD endpoint 30 in the second partition 54 (block 78).

The control system 14 further instantiates an interface in the first partition 52 that communicatively couples the JTAG hub 60 to the JTAG-based logic (block 80). For example, the control system 14 may instantiate the SLD endpoint interface 62 that communicatively couples the JTAG hub 60 to the SLD endpoint 30 in the second partition 54.

The control system 14 may remove the SLD endpoint 30, add another SLD endpoint 30, or otherwise change the SLD endpoint 30 (e.g., based on user instruction). In response, the control system 14 (e.g., through the EDA tool 15) may at least partially recompile at least a portion of the JTAG hub 60 and the SLD endpoint interface 62. In some embodiments, the control system 14 may recompile the partial reconfiguration region 64 that includes the portion of the JTAG hub 60 and the SLD endpoint interface 62 that provides JTAG functionality to the SLD endpoint interface 62. The control system 14 may incrementally compile the portion of the JTAG hub 60 and the SLD endpoint interface 62, such that other portions of the partial reconfiguration region 64 are not compiled. In this manner, multiple partitions may share and use the JTAG interface 12.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit device comprising:

a first partition and a second partition; and a boundary scan system configured to control at least a portion of the integrated circuit device via a plurality of logic signals, wherein the boundary scan system comprises:

a boundary scan interface configured to receive the plurality of logic signals;

a boundary scan hub instantiated in the first partition and being communicatively coupled to the boundary scan interface;

boundary scan-based logic instantiated in the second partition; and an interface instantiated in the first partition configured to communicatively couple the boundary scan hub to the instantiated boundary scan-based logic;

wherein the second partition is configured to be reconfigured by:

loading a partial reconfiguration file in the second partition while the first partition concurrently runs an application; and instantiating the boundary scan-based logic in the second partition while the first partition concurrently runs the application in response to loading the partial reconfiguration file in the second partition.

2. The integrated circuit device of claim 1, wherein the boundary scan-based logic comprises a system level debugging (SLD) endpoint.

3. The integrated circuit device of claim 2, wherein the SLD endpoint comprises an In-System Sources and Probes (ISSP) interface, a SignalTap (STAP) interface, an In-System Memory Content Editor (ISMCE) interface, a Debug Bus Master interface, a Debug Packet Streamer interface, or a Microprocessor Debugger Module interface.

4. The integrated circuit device of claim 2, wherein a partial reconfiguration region of the first partition comprises at least a portion of the boundary scan hub associated with providing the boundary scan interface to the SLD endpoint and the interface.

5. The integrated circuit device of claim 4, wherein the boundary scan interface is communicatively coupled to one or more electronic design automation (EDA) software tools configured to recompile the partial reconfiguration region in response to removing the SLD endpoint from the second partition.

6. The integrated circuit device of claim 4, wherein the boundary scan interface is communicatively coupled to one or more electronic design automation (EDA) software tools configured to reconfigure the partial reconfiguration region in response to adding a second SLD endpoint to the second partition.

7. A boundary scan system comprising:

a boundary scan interface of an integrated circuit configured to receive a plurality of boundary scan logic signals;

a boundary scan hub instantiated in a first partition of the integrated circuit and communicatively coupled to the boundary scan interface;

a system level debugging (SLD) endpoint instantiated in a second partition of the integrated circuit; and an SLD endpoint interface instantiated in the first partition configured to communicatively couple the boundary scan hub to the instantiated SLD endpoint;

wherein the second partition is configured to recompile while the first partition concurrently runs an application, wherein recompiling the second partition comprises one or more of maintaining instantiation of the instantiated SLD endpoint, modifying the instantiated SLD endpoint, removing the instantiated SLD endpoint, or instantiating an additional SLD endpoint in the second partition.

8. The boundary scan system claim 7, comprising a computing device communicatively coupled to the boundary scan interface.

9. The boundary scan system claim 8, wherein the computing device comprises one or more electronic design automation (EDA) software tools.

10. The boundary scan system claim 9, wherein the one or more EDA software tools are configured to automatically reconfigure at least a portion of the boundary scan hub and the SLD endpoint interface in response to removing the instantiated SLD endpoint from the second partition or instantiating the additional SLD endpoint in the second partition.

11. The boundary scan system claim 10, wherein automatically reconfiguring at least the portion of the boundary scan hub and the SLD endpoint interface comprises compiling at least the portion of the boundary scan hub and the SLD endpoint interface while concurrently running one or both of the application on the first partition or an additional application on the second partition.

12. The boundary scan system claim 10, wherein the one or more EDA software tools are configured to automatically reconfigure at least the portion of the boundary scan hub and the SLD endpoint interface without altering the application running on the second partition.

13. A method comprising:
- creating a first partition in an integrated circuit;
- instantiating a boundary scan hub in the first partition, the boundary scan hub being communicatively coupled to a boundary scan interface;
- creating a second partition in the integrated circuit;
- instantiating boundary scan-based logic in the second partition;
- instantiating an interface in the first partition that is configured to communicatively couple the boundary scan hub to the instantiated boundary scan-based logic; and
- recompiling the second partition while concurrently running an application on the first partition, wherein recompiling the second partition comprises one or more of maintaining instantiation of the instantiated boundary scan-based logic, modifying the instantiated boundary scan-based logic, removing the instantiated boundary scan-based logic, or instantiating additional boundary scan-based logic in the second partition.

14. The method of claim 13, wherein the boundary scan-based logic comprises a system level debugging (SLD) endpoint.

15. The method of claim 14, wherein a partial reconfiguration region of the first partition comprises at least a portion of the boundary scan hub associated with providing the boundary scan interface to the SLD endpoint and the interface.

16. The method of claim 15, comprising recompiling the partial reconfiguration region in response to removing the SLD endpoint from the second partition.

17. The method of claim 16, wherein recompiling the partial reconfiguration region comprises compiling at least a portion of the partial reconfiguration region associated with providing the boundary scan interface to the SLD endpoint while concurrently running one or both of the application on the first partition or an additional application on the second partition.

18. The method of claim 15, comprising recompiling the partial reconfiguration region in response to adding a second SLD endpoint to the second partition.

19. The method of claim 18, wherein recompiling the partial reconfiguration region comprises compiling at least a portion of the partial reconfiguration region associated with providing the boundary scan interface to the second SLD endpoint while concurrently running one or both of the application on the first partition or an additional application on the second partition.

20. The method of claim 13, wherein instantiating one or more of the boundary scan hub, the boundary scan-based logic, or the interface comprises configuring one or both of a reconfigurable logic element or routing wire in the respective first partition or second partition to generate one or more instances of the one or more of the boundary scan hub, the boundary scan-based logic, or the interface.

* * * * *